(12) United States Patent
Kim

(10) Patent No.: US 7,226,838 B2
(45) Date of Patent: Jun. 5, 2007

(54) METHODS FOR FABRICATING A SEMICONDUCTOR DEVICE

(75) Inventor: Seok Su Kim, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/745,854

(22) Filed: Dec. 26, 2003

(65) Prior Publication Data
US 2004/0137682 A1   Jul. 15, 2004

(30) Foreign Application Priority Data
Dec. 31, 2002   (KR) .................. 10-2002-0087894

(51) Int. Cl.
*H01L 21/336* (2006.01)
(52) U.S. Cl. .............. 438/257; 438/265; 438/595; 257/E21.179
(58) Field of Classification Search .......... 438/257, 438/265, 595; 257/E21.179
See application file for complete search history.

(56) References Cited

U.S. PATENT DOCUMENTS

| 5,618,742 | A | 4/1997 | Shone et al. ............ 438/263 |
|---|---|---|---|
| 6,101,131 | A | 8/2000 | Chang .................. 365/185.33 |
| 6,255,172 | B1* | 7/2001 | Huang et al. ............... 438/266 |
| 6,355,524 | B1* | 3/2002 | Tuan et al. ................. 438/257 |
| 6,372,618 | B2* | 4/2002 | Forbes et al. ............... 438/596 |
| 6,432,773 | B1* | 8/2002 | Gerber et al. ............... 438/261 |
| 2002/0060332 | A1* | 5/2002 | Ikeda et al. ................. 257/298 |

* cited by examiner

*Primary Examiner*—Trung Dang
(74) *Attorney, Agent, or Firm*—Saliwanchik, Lloyd & Saliwanchik

(57) ABSTRACT

Methods of fabricating a semiconductor device is disclosed. An illustrated method comprises: providing a substrate including an active region and a non-active region; forming a first gate electrode including a dielectric layer pattern, a first conducting layer pattern, and an insulating layer pattern; growing a thermal oxide layer on the substrate and the first gate electrode; forming a nitride layer over the substrate and the thermal oxide layer; and removing the nitride layer and the thermal oxide layer using an etch back process to form spacers on sidewalls of the first gate electrode. By including the thermal oxide layer, the spacers ensure insulation capability.

3 Claims, 3 Drawing Sheets

METHODS FOR FABRICATING A SEMICONDUCTOR DEVICE

FIELD OF THE DISCLOSURE

The present invention relates to a method for fabricating a semiconductor device and, more particularly, to a method for fabricating a McRAM device that includes a first gate electrode functioning as a flash memory and a second gate electrode functioning as a normal gate electrode formed on a single substrate.

BACKGROUND

In view of the rapid spread of intelligent devices such as computers, semiconductor devices are being rapidly developed. Semiconductor devices are now being required to have high storage-capacity and to operate at high speed. To meet these requirements, technologies for manufacturing semiconductor devices are being developed with an eye toward improving the degree of integration, the reliability, and the response rate of the semiconductor devices.

Generally, semiconductor memory devices are divided into volatile and nonvolatile memory devices. Examples of nonvolatile memory devices include a flash memory device, a McRAM device, etc. The McRAM device includes a first gate electrode functioning as a flash memory and a second gate electrode functioning as a normal gate electrode in a single cell. The McRAM device has recently been in the spotlight due to its advantages (e.g., low power dissipation, low manufacturing cost, and rapid speed of information processing).

FIGS. 1 through 4 are cross-sectional views illustrating a conventional prior art process for fabricating a McRAM device.

Referring to FIG. 1, a substrate 1 including an active region 2 and a non-active region 3 is provided. A dielectric layer 5, a first conducting layer 7, and an insulating layer 9 are sequentially deposited on the substrate 1. Then, a mask pattern 4 is formed over the insulating layer 9.

Referring to FIG. 2, some parts of the insulating layer 9, the first conducting layer 7, and the dielectric layer 5 are sequentially removed through an etching process using the mask pattern 4 as an etching mask. As a result, a first gate electrode 10 comprising an insulating layer pattern 9a, a first conducting layer pattern 7a, and a dielectric layer pattern 5a is formed on the active region 2 of the substrate 1. The first gate electrode 10 functions as a flash memory. Next, an oxide layer 11 and a nitride layer 13 are sequentially deposited on the substrate 1 and the first gate electrode 10.

Referring to FIG. 3, the nitride layer 13 and the oxide layer 11 are removed by an etch back process to form spacers 14. The spacers 14 comprise an oxide pattern 11a and a nitride pattern 13a on sidewalls of the first gate electrode 10. The nitride pattern 13a may impose stress on the first conducting layer pattern 7a of the first gate electrode 10, although it can effectively prevent a silicide layer from being formed in following processes. Therefore, in forming the spacers 14, the oxide layer 11, which mitigates the stress more or less, is first deposited and, then, the nitride layer 13 is deposited on the oxide layer 11.

Referring to FIG. 4, another oxide layer 15 is deposited on the substrate 1, but the oxide layer 15 is not deposited on the first gate electrode 10 or the spacers 14. Then, a second conducting layer 17 is deposited over the oxide layer 15, the first gate electrode 10, and the spacers 14. A residual insulating layer, which remains on the active region 2 after the formation of the first gate electrode 10, has to be completely removed prior to the deposition of the oxide layer 15. The residual insulating layer is removed by wet etching. However, when the insulating layer is removed, a portion of the oxide pattern 11a of the spacers 14 may also be removed by the etching process. In addition, if the first conducting layer pattern 7a is exposed through an etched part "A" of the spacers 14, a bridge between the first conducting layer pattern 7a and the second conducting layer 17 may occur. Therefore, in fabricating a first gate electrode and a second gate electrode which functions as a normal gate electrode, conventional methods frequently cause device defects due to deterioration in the insulation capability.

The prior art Shone et al., U.S. Pat. No. 5,618,742, describes a method of making a flash EPROM with conductive sidewall spacers contacting a floating gate. The method for fabricating a plurality of flash EPROM transistors according to the above-mentioned U.S. Patent comprises forming a floating gate insulating layer over a substrate; defining a plurality of strips of polysilicon in a first polysilicon layer over the floating gate insulating layer; exposing the substrate to dopants; annealing the substrate to drive the dopants into the doped regions; forming a thicker insulator with an insulating material over buried diffusion regions; exposing the plurality of strips of polysilicon; depositing a second polysilicon layer over and in contact with the plurality of strips; etching the second polysilicon layer for a time to form self-aligned conductive spacer lines; forming a control gate insulator over the plurality of strips and the conductive spacer lines; depositing a third polysilicon layer over the control gate insulator; and etching the third layer, the conductive spacers, and the plurality of conductive strips to define control gate conductors and floating gates.

DETAILED DESCRIPTION

Figure 1:
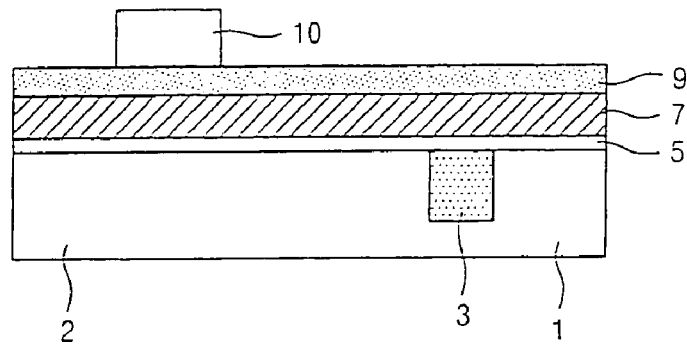
FIGS. 1 through 4 are cross-sectional views illustrating a prior art process for fabricating a conventional McRAM device.
Figure 2:
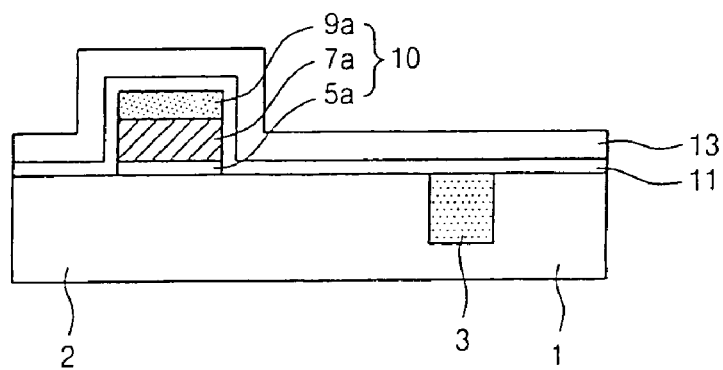
Figure 3:
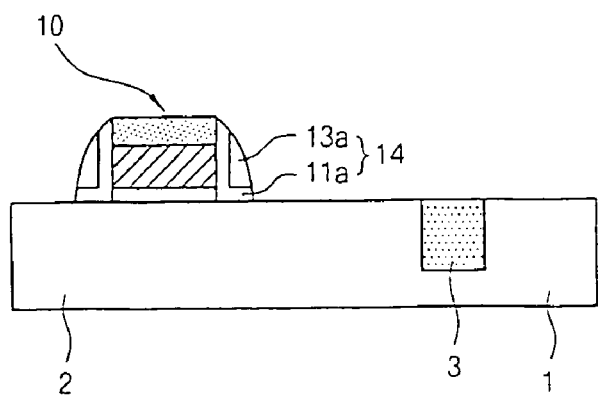
Figure 4:
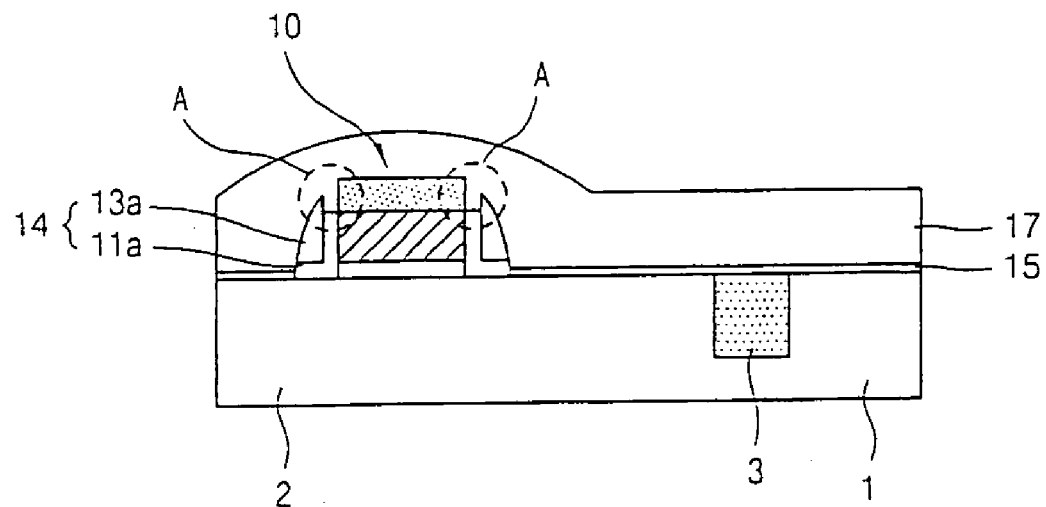
Figure 5:
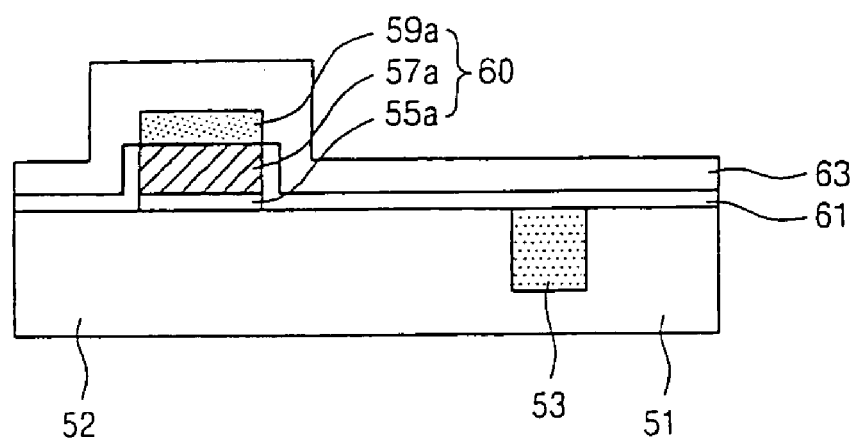
FIGS. 5 through 7 are cross-sectional views illustrating an example process for fabricating a semiconductor device in accordance with the teachings of the present disclosure.

Referring to FIG. 5, a substrate 51 including an active region 52 and a non-active region 53 is provided. The non-active region 53 is preferably a trench structure or field oxide formed by LOCOS (local oxidation of silicon). A dielectric layer, a first conducting layer, and a first insulating layer are sequentially deposited over the substrate 51. The first conducting layer is preferably polysilicon. The first insulating layer is preferably oxide or nitride. A photoresist pattern is subsequently formed on the first insulating layer by photolithography. Some parts of the dielectric layer, the first conducting layer, and the first insulating layer are removed through the photoresist pattern to form a dielectric layer pattern 55a, a first conducting layer 57a, and a first insulating layer pattern 59a, respectively. As a result, a first gate electrode 60 comprising the dielectric layer pattern 55a, the first conducting layer pattern 57a, and the first insulating layer pattern 59a is formed on the active region 52 of the substrate 51. The first gate electrode 60 functions as a flash memory.

Next, a thermal oxide layer 61 is grown on the substrate 51 and on the first gate electrode 60. The thermal oxide layer 61 is grown only on the surface of the substrate 51, on the sidewalls of the dielectric layer pattern 55a and on the sidewalls of the first conducting layer pattern 57a. In other words, the thermal oxide layer 61 is not grown on the sidewalls of the first insulating layer pattern 59a. Next, a nitride layer 63 is deposited over the thermal oxide layer 61 and the first gate electrode 60.

Figure 6:
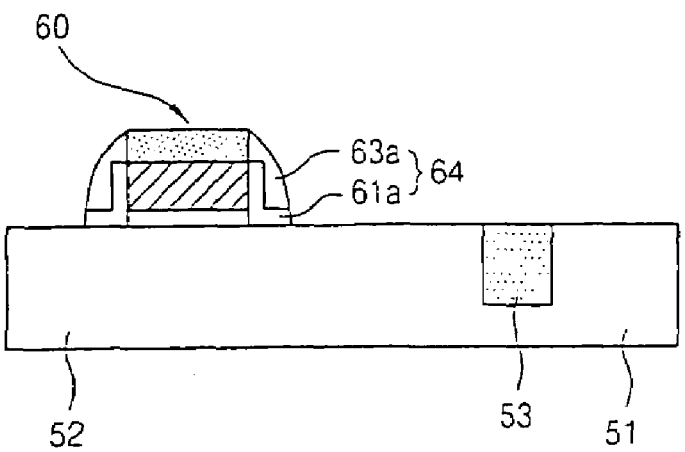

Referring to FIG. 6, the nitride 63 layer and the thermal oxide layer 61 are removed by an etch back process to form spacers 64 on the sidewalls of the first gate electrode 60. The spacers 64 comprise a nitride layer pattern 63a and a thermal oxide layer pattern 61a. The sidewalls of the first gate electrode 60 are completely covered with the nitride pattern 63a because the thermal oxide layer pattern 61a is not formed on the sidewalls of the first insulating layer pattern 59a.

The operation characteristics of the first gate electrode 60 are not influenced because the sidewalls of the first conducting layer pattern 57a are in contact with the thermal oxide layer pattern 61a. Further, the thermal oxide pattern 61a does not impose stress on the first conducting layer pattern 57a. In addition, in a following process, a silicide layer is not formed on the spacers 64 because the nitride layer pattern 63a completely covers the thermal oxide layer pattern 61a and prevents the formation of the silicide layer on the spacers 64.

Figure 7:
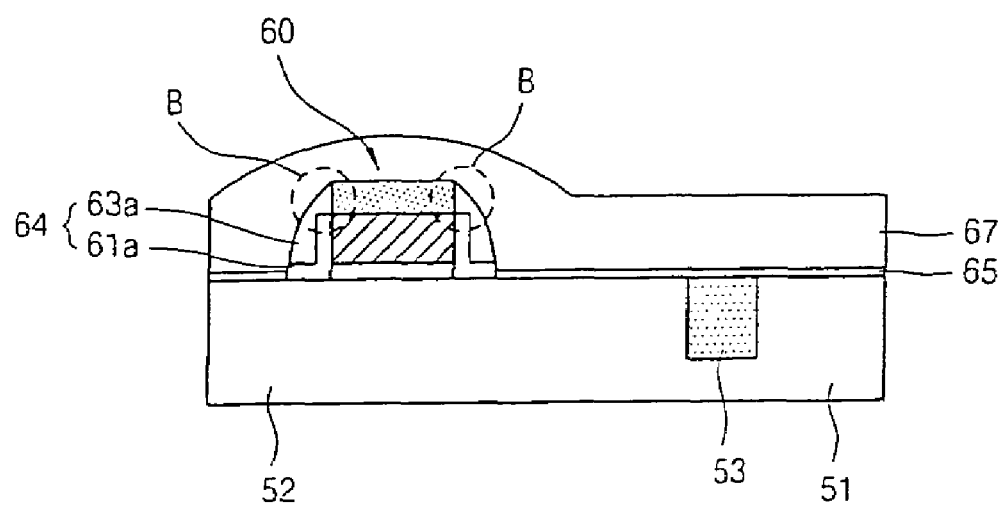

Referring to FIG. 7, an oxide layer 65 is formed on the substrate 51, but not on the spacers 64 or on the first gate electrode 60. Then, a second conducting layer 67 is formed over the oxide layer 65, the spacers 64, and the first gate electrode 60. The second conducting layer 67 is preferably polysilicon.

Prior to the formation of the oxide layer 65, if a residual insulating layer for the formation of the first gate electrode remains on the substrate 51, the residual insulating layer should be removed by etching, preferably by wet etching. If the residual insulating layer is oxide, it is preferably removed by wet etching using phosphoric acid. The etching process does not influence the thermal oxide layer pattern 61a of the spacers 64 because the thermal oxide layer pattern 61a is covered with the nitride pattern 63a.

Next, a mask layer is formed on the second conducting layer 67 by photolithography. An etching process is performed using the mask layer as an etching mask. As a result, a second gate electrode comprising a gate oxide and a second conducting layer pattern is formed on the substrate. The second gate electrode functions as a normal gate electrode.

Accordingly, a bridge between the first conducting layer pattern 57a and the second conducting layer pattern does not occur because the spacers 64 have sufficient insulation capability.

In the illustrated method for fabricating a semiconductor device, the spacers 64 formed on the sidewalls of a first gate electrode 60 comprise thermal oxide and nitride which completely covers the thermal oxide. The spacers 64 are protected from damage during the following etching process and, therefore, ensure sufficient insulating capability. Accordingly, the illustrated fabrication method improves the reliability of the fabricated semiconductor devices.

From the foregoing, persons of ordinary skill in the art will appreciate that the above disclosed methods and apparatus ensure the insulation capability of the spacers that are formed on the sidewalls of a first gate electrode functioning as a flash memory.

The illustrated method for fabricating a semiconductor device comprises: providing a substrate including an active region and a non-active region; forming a first gate electrode comprising a dielectric layer pattern, a first conducting layer pattern, and an insulating layer pattern, the first gate electrode functioning as a flash memory; growing a thermal oxide layer on the substrate and on the first gate electrode; forming a nitride layer over the substrate and the thermal oxide layer; and removing the nitride layer and the thermal oxide layer using an etch back process to form spacers on the sidewalls of the first gate electrode, the spacers comprise a nitride layer pattern and a thermal oxide layer pattern.

The thermal oxide layer on the sidewalls of the first gate electrode are grown only on the sidewalls of the dielectric layer pattern and the sidewalls of the first conducting layer pattern and, therefore, the nitride layer formed on the thermal oxide layer can ensure sufficient insulation capability. Accordingly, by including the thermal oxide layer, the spacers maintain insulation capability even though, in following processes another oxide layer and a second conducting layer are sequentially deposited over the substrate and etched to form a second gate electrode functioning as a normal gate electrode.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a semiconductor device comprising:
    providing a semiconductor substrate;
    forming a first gate electrode including a dielectric layer pattern, a first conducting layer pattern, and an insulating nitride layer pattern, the first gate electrode functioning as a flash memory, wherein the first conductive layer pattern consists of conductive material and the insulating nitride layer pattern is formed in contact with the first conducting layer pattern;
    growing a thermal oxide layer on the semiconductor substrate, on sidewalls of the dielectric layer pattern and on sidewalls of the first conducting layer pattern up to a height of the first conducting layer such that the thermal oxide layer is not grown above the first conducting layer and is not grown on the sidewalls of the insulating nitride layer pattern;
    forming a nitride layer on the thermal oxide layer and on the insulating nitride layer pattern;
    partially removing the nitride layer and the thermal oxide layer to form spacers on sidewalls of the first gate electrode, the spacers comprising the nitride layer pattern and the thermal oxide layer pattern;
    forming a second oxide layer on the semiconductor substrate but not on the first gate electrode or the spacers; and
    forming a second conducting layer over the second oxide layer, the first gate electrode, and the spacers.

2. The method as defined by claim 1, further comprising removing a residual insulating layer from the formation of the first gate electrode from the substrate.

3. The method as defined by claim 1, wherein the thermal oxide layer is removed by an etch-back process.

* * * * *